United States Patent
Asmanis et al.

(10) Patent No.: US 9,755,760 B2
(45) Date of Patent: Sep. 5, 2017

(54) SUPPLY VOLTAGE MODULAR PHOTODIODE BIAS

(71) Applicant: Avago Technologies General IP (Singapore) Pte. Ltd., Singapore (SG)

(72) Inventors: Georgios Asmanis, Lake Forest, CA (US); Faouzi Chaahoub, San Jose, CA (US); Michael A. Robinson, Fremont, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/875,228

(22) Filed: Oct. 5, 2015

(65) Prior Publication Data

US 2017/0099111 A1    Apr. 6, 2017

(51) Int. Cl.
| | |
|---|---|
| *H04B 10/06* | (2006.01) |
| *H04B 10/00* | (2013.01) |
| *H01J 40/14* | (2006.01) |
| *H01L 31/00* | (2006.01) |
| *H01J 27/00* | (2006.01) |
| *H04B 10/61* | (2013.01) |
| *H03K 17/60* | (2006.01) |
| *H03K 17/687* | (2006.01) |
| *H03F 3/08* | (2006.01) |
| *H01L 27/08* | (2006.01) |

(52) U.S. Cl.
CPC ............ *H04B 10/616* (2013.01); *H03K 17/60* (2013.01); *H03K 17/6877* (2013.01); *H01L 27/08* (2013.01); *H03F 3/087* (2013.01)

(58) Field of Classification Search
CPC ...... H04B 10/616; H04B 10/06; H04B 10/61; H03K 17/60; H03K 17/6877; H03K 17/687; H03F 3/087; H03F 1/08; H03F 1/26; H03F 1/30; H03F 3/45475; H03F 1/301; H03F 3/04; H03F 3/08; H03F 3/45; H03F 3/082; G01J 1/44; H01L 31/107; H01L 31/02019; H01L 27/0928; H01L 27/085; H01L 27/092; H01L 27/0802; H01L 27/08; G02B 6/36; H03G 3/3084
USPC ............. 398/210; 250/214 R, 214.1; 702/58
See application file for complete search history.

(56) References Cited

U.S. PATENT DOCUMENTS

| | | | | |
|---|---|---|---|---|
| 5,373,152 A | * | 12/1994 | Domon | H04B 10/6973 250/214 AG |
| 5,442,321 A | * | 8/1995 | Bayruns | H03G 3/3084 330/133 |

(Continued)

OTHER PUBLICATIONS

"11.3 Gbps Limiting Transimpedance Amplifier With RSSI", ONET8531T, Texas Instruments Incorporated, Feb. 2008, 17 pages.

*Primary Examiner* — Ken N Vanderpuye
*Assistant Examiner* — Abbas H Alagheband
(74) *Attorney, Agent, or Firm* — Sheridan Ross P.C.

(57) ABSTRACT

An optical communication system, circuit, and Integrated Circuit (IC) chip are disclosed. The disclosed optical communication system includes a photodiode configured to receive light energy and convert the light energy into an electrical signal, an amplifier configured to receive the electrical signal from the photodiode and output an amplified electrical signal, and a control circuit comprising a biasing network that generates a modular logic level that scales with a bias voltage of the photodiode.

20 Claims, 4 Drawing Sheets

(56) References Cited

U.S. PATENT DOCUMENTS

| | | | | |
|---|---|---|---|---|
| 6,407,618 B1* | 6/2002 | Taft | ............... | G05F 3/205 327/102 |
| 6,541,752 B2* | 4/2003 | Zappa | ............... | G01J 1/44 250/214.1 |
| 6,882,215 B1* | 4/2005 | Lee | ............... | G05F 3/205 327/536 |
| 7,418,213 B2* | 8/2008 | Denoyer | ............... | H03F 1/08 250/214 C |
| 7,439,482 B2* | 10/2008 | Byren | ............... | H04B 10/6911 250/214 R |
| 7,466,922 B2* | 12/2008 | Pierce | ............... | H04B 10/40 398/135 |
| 7,663,090 B2* | 2/2010 | Byren | ............... | H04B 10/6911 250/214 R |
| 7,876,155 B2* | 1/2011 | Aroca | ............... | H03F 3/08 330/260 |
| 8,290,726 B2* | 10/2012 | Schmidt | ............... | G01R 31/2635 702/182 |
| 9,641,251 B1* | 5/2017 | Radice | ............... | H04B 10/25073 |
| 2002/0140010 A1* | 10/2002 | Vu | ............... | H01L 27/14621 257/294 |
| 2002/0145107 A1* | 10/2002 | Deschamps | ............... | H01J 40/14 250/214 R |
| 2003/0146797 A1* | 8/2003 | Atsumi | ............... | G04F 5/14 331/94.1 |
| 2004/0057172 A1* | 3/2004 | Sun | ............... | H01L 27/0259 361/56 |
| 2004/0159776 A1* | 8/2004 | Richard | ............... | H03K 19/14 250/214 R |
| 2005/0001151 A1* | 1/2005 | Nakazawa | ............... | H04B 10/6911 250/214 R |
| 2005/0238360 A1* | 10/2005 | Taylor | ............... | H01S 5/06203 398/138 |
| 2005/0286902 A1* | 12/2005 | Pierce | ............... | H04B 10/40 398/139 |
| 2006/0034621 A1* | 2/2006 | Denoyer | ............... | H03F 1/08 398/208 |
| 2007/0152136 A1* | 7/2007 | Yao | ............... | H03F 1/08 250/214 A |
| 2008/0017785 A1* | 1/2008 | Byren | ............... | H04B 10/6911 250/214 R |
| 2010/0265076 A1* | 10/2010 | Ichino | ............... | H01S 5/06804 340/584 |
| 2011/0270543 A1* | 11/2011 | Schmidt | ............... | G01R 31/2635 702/58 |
| 2012/0306577 A1* | 12/2012 | Staab | ............... | H03F 3/082 330/288 |
| 2013/0294766 A1* | 11/2013 | Cai | ............... | H04B 10/07953 398/26 |
| 2014/0231623 A1* | 8/2014 | Serrano Gotarredona | ............... | H03F 1/086 250/208.1 |
| 2014/0291487 A1* | 10/2014 | Laforce | ............... | H01L 31/02 250/214 LA |

* cited by examiner

SUPPLY VOLTAGE MODULAR PHOTODIODE BIAS

FIELD OF THE DISCLOSURE

The present disclosure is generally directed toward circuits for biasing photodiodes.

BACKGROUND

A PIN diode is essentially a variable resistor that converts optical energy to electrical current. Both the resistance and the responsivity of the PIN are parametric to the bias conditions of the diode. Due to the nature of the way that a PIN diode operates, there is usually a need for PIN bias schemes to ensure that the PIN operates in an appropriate fashion. Especially in optical communication systems, a PIN diode at the receiver side of the optical communication system will benefit from a bias scheme. Most optical communication systems that employ a PIN diode also utilize a transimpedance amplifier (TIA) to help amplify the electrical signal output by the PIN diode.

Traditional PIN bias schemes utilize an external supply voltage for biasing the photodiode. High performance photodiodes often require a high supply voltage that is often greater than the supply voltage of the TIA. The use of an external photodiode bias voltage leads to a high frequency ground path through a decoupling capacitor that is not the same to the TIA's connection to the ground. These different ground paths can greatly degrade an optical receiver's high speed performance.

BRIEF DESCRIPTION OF THE DRAWINGS

The present disclosure is described in conjunction with the appended figures, which are not necessarily drawn to scale.

DETAILED DESCRIPTION

Figure 1:
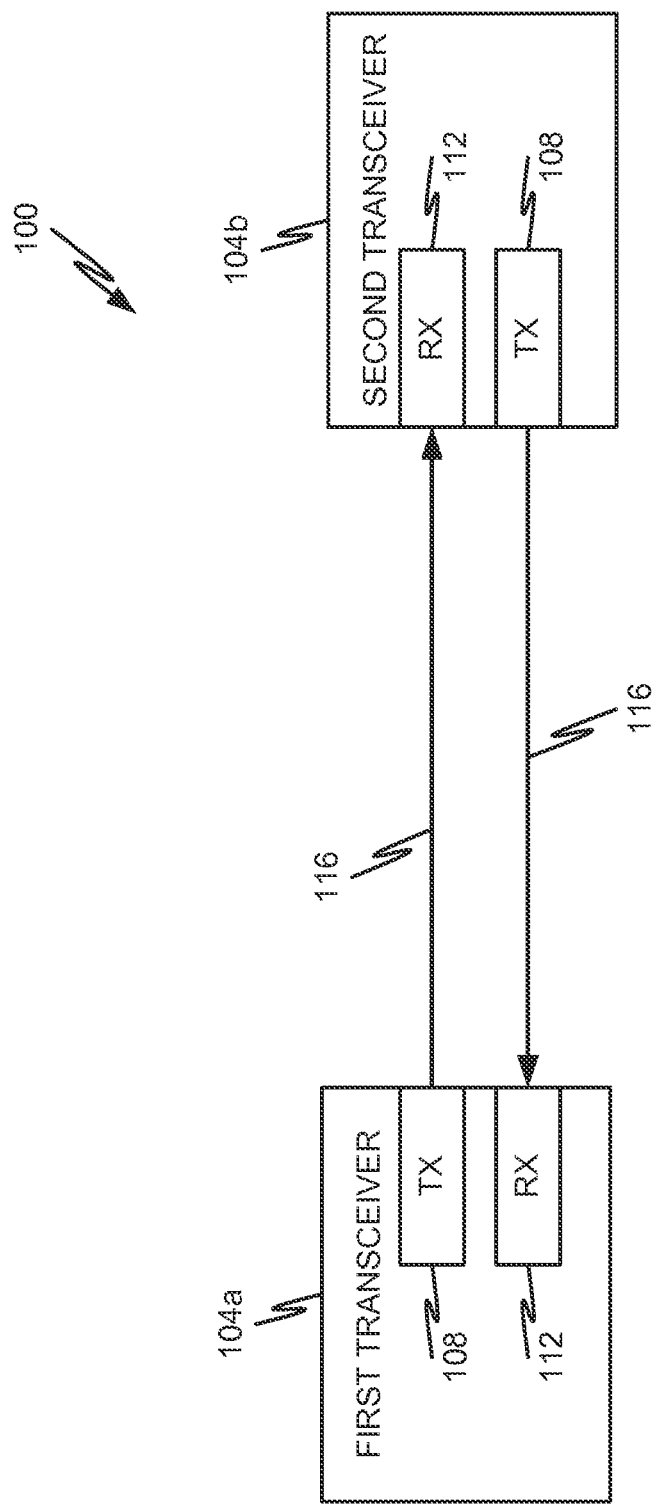
FIG. 1 is a block diagram depicting an optical communication system in accordance with at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Although embodiments of the present disclosure will be described in connection with controlling a photodiode, such as a PIN diode, it should be appreciated that embodiments of the present disclosure are not so limited. To the contrary, any circuit element exhibiting a behavior that can benefit from some type of biasing network could utilize embodiments of the present disclosure. Furthermore, embodiments of the present disclosure are not limited to communication systems or optoelectronic components of communication systems. Instead, embodiments of the present disclosure can be used in a wide variety of environments including computing applications, server applications, data centers, etc.

In some embodiments, a photodiode (e.g., a PIN photodiode) bias scheme is described that employs an on-chip filter or filtering network to bias the photodiode and ensure there exists a balanced high frequency ground path between the photodiode and a transimpedance amplifier (TIA) connected to the photodiode. A PIN photodiode is one example of an optoelectronic component that can benefit from a bias network as disclosed herein. A PIN photodiode is a type of photo detector that is capable of converting optical signals into electrical signals.

PIN photodiodes have three regions: a P-region, an I-region, and an N-region. The P-region and N-region are relatively heavily doped as compared to similar regions of traditional p-n diodes. The I-region corresponds to an intrinsic region positioned between the P-region and the I-region. In some embodiments, the width of the I-region is larger than the space charge width of a traditional p-n junction. The PIN photodiode operates with an applied reverse bias voltage and when the reverse bias is applied, the space charge region covers the intrinsic region completely. Electron hole pairs are generated in the space charge region by photon absorption.

With reference now to FIG. 1, an illustrative communication system 100 in which embodiments of the present disclosure may be utilized will be described. The system 100 is shown to include one or more transceivers 104a, 104b, each having a transmitter 108 and a receiver 112. The transceivers 104a, 104b are shown to communicate with one another via one or more communication channels 116 that connect a transmitter 108 with a receiver 112. It should be appreciated that embodiments of the present disclosure may also be implemented in a communication system having dedicated transmitters 108 and receivers 112 instead of a combination of a transmitter 108 and receiver 112 being implemented in a transceiver 104.

In some embodiments, the communication channel 116 may carry an analog signal that is modulated according to any type of known modulation technique, such as Amplitude Modulation, Pulse Amplitude Modulation, Non-Return to Zero Modulation, Double-Sideband Modulation, Vestigal Sideband Modulation, Quadrature Amplitude Modulation, Frequency Modulation, Phase Modulation, combinations thereof, or the like. The communication channel 116 may include a wired communication medium (e.g., a physical wire, coaxial cable, fiber-optics, etc.), a wireless communication medium (e.g., air), or a combination of wired and wireless media. It should be appreciated that the transmitter 108 may be configured to first receive a digital signal as an input (e.g., from a digital circuit or digital circuit components, such as an IC or IC component or processor core) and then convert the digital signal into an analog signal for transmission across the communication channel 116. The receiver 112 may be configured to receive the analog signal from the communication channel 116 and convert the analog signal back into a digital signal for processing by a digital circuit or processor core that is connected to an output of the receiver 112. It should be appreciated that the communication channel 116 may traverse long or short distances. For instance, the communication channel 116 may correspond to a short interconnection between components on an IC chip. In some embodiments, the communication channel 116 may correspond to a SerDes channel. As another example, the communication channel 116 may correspond to a long interconnection (e.g., on the order of miles) between a transmitting station and a receiving station.

In a specific, but non-limiting example of the communication system, signals carried between the transmitter 108 and receiver 112 are transmitted at a relatively high frequency (e.g., 20 GHz, 25 GHz, 40 GHz, or greater) using a modulation technique that doubles the achievable data rate for a given link bandwidth. More specific types of modulation techniques that may be used in the communication system 100 include, without limitation, a Pulse Amplitude Modulation (PAM)-N modulation scheme (e.g., PAM-2, PAM-4, PAM-8, etc.) or a QPSK heterodyne modulation technique.

Figure 2:
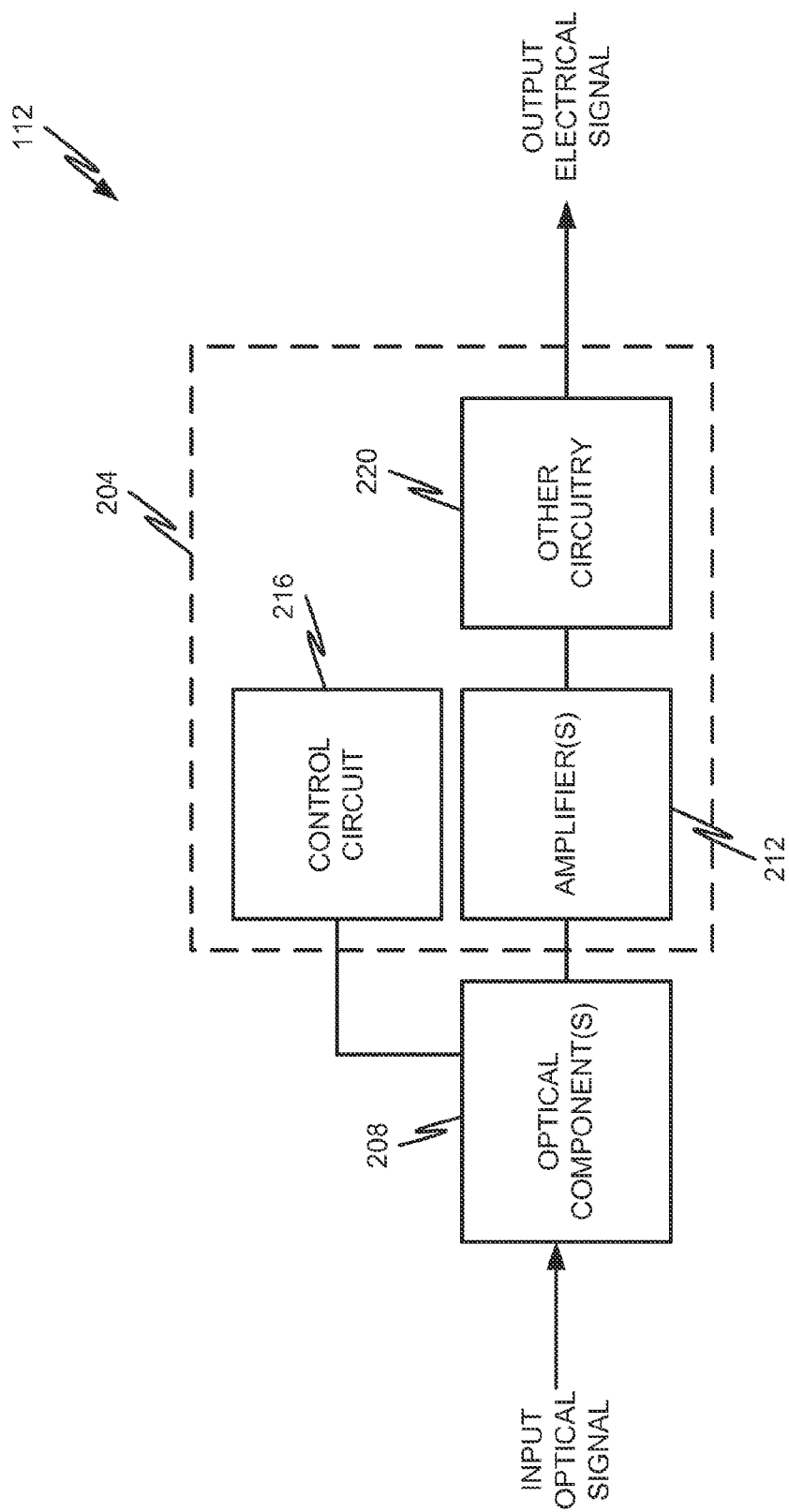
FIG. 2 is a block diagram depicting an optical receiver in accordance with at least some embodiments of the present disclosure.

With reference now to FIG. 2, additional details of a receiver 112 will be described in accordance with at least some embodiments of the present disclosure. The receiver 112 is shown to include an Integrated Circuit (IC) chip 204 connected to one or more optical components 208. The IC chip 204 is further shown to include one or more amplifiers 212, a control circuit 216, and other circuitry 220.

The receiver 112 is configured to receive an input optical signal and produce an output electrical signal using the combined functionality of the optical component(s) 208 and the IC chip 204. Although certain components are depicted as being integrated into the IC chip 204, it should be appreciated that some of those components may be provided external to the IC chip 204. For instance, some or all of the control circuit 216 may be provided external to the IC chip 204. As another example, some or all of the amplifiers 212 may be provided external to the IC chip 204. As will be discussed herein, however, there may be certain advantages to including some components in the IC chip 204, such as the ability to provide an integrated solution for the receiver 112 and/or provide a common ground for both the amplifier(s) 212 and control circuit 216.

The optical component(s) 208 may correspond to any type of active or passive optoelectronic device or collection of devices that are capable of converting optical signals into electrical signals. Examples of such optical components include photodiodes, PIN photodiodes, arrays of photodiodes, arrays of PIN photodiodes, and the like. Because the output of the optical component(s) 208 may not be large/strong enough for subsequent processing by other circuitry, the output of the optical component(s) 208 may be provided to the one or more amplifiers 212 for signal amplification. The amplifier(s) 212 may include a TIA or a plurality of TIAs connected serially. The amplifier(s) 212 may provide their output to other circuitry 220, which may or may not be incorporated into the IC chip 204. Suitable examples of other circuitry 220 include variable gain amplifiers (VGAs), digital circuitry components (e.g., logic gates, latches, switches, etc.), and the like. The other circuitry 220 can also include one or more TIAs without departing from the scope of the present disclosure. Conversely, the amplifier(s) 212 can included one or more VGAs or the like.

The other circuitry 220 is not a required element of the IC chip 204. Thus, some embodiments of the present disclosure may provide outputs from amplifier(s) 212 as an output electrical signal from the IC chip 204 without passing the amplified output of the amplifier(s) 212 to other circuitry 220. In some embodiments, the IC chip 204 comprises one or more leads or external connectors that connect the circuitry of the IC chip 204 to external circuitry, such as a Printed Circuit Board (PCB) or the like. Thus, the output electrical signal of the IC chip 204 is usually provided to another circuit, collection of circuits, or IC chips via traces or electrically-conductive vias in a PCB or similar type of substrate.

The control circuit 216, in some embodiments, is configured to facilitate utilization of certain optical components 208 in a high performance application (e.g., a high power and/or high switching speed receiver 112). In some embodiments, the control circuit 216 comprises components that enable a biasing of the optical component(s) 208, even if a supply voltage is greater than the maximum operational voltage of the amplifier(s) 212.

Figure 3:
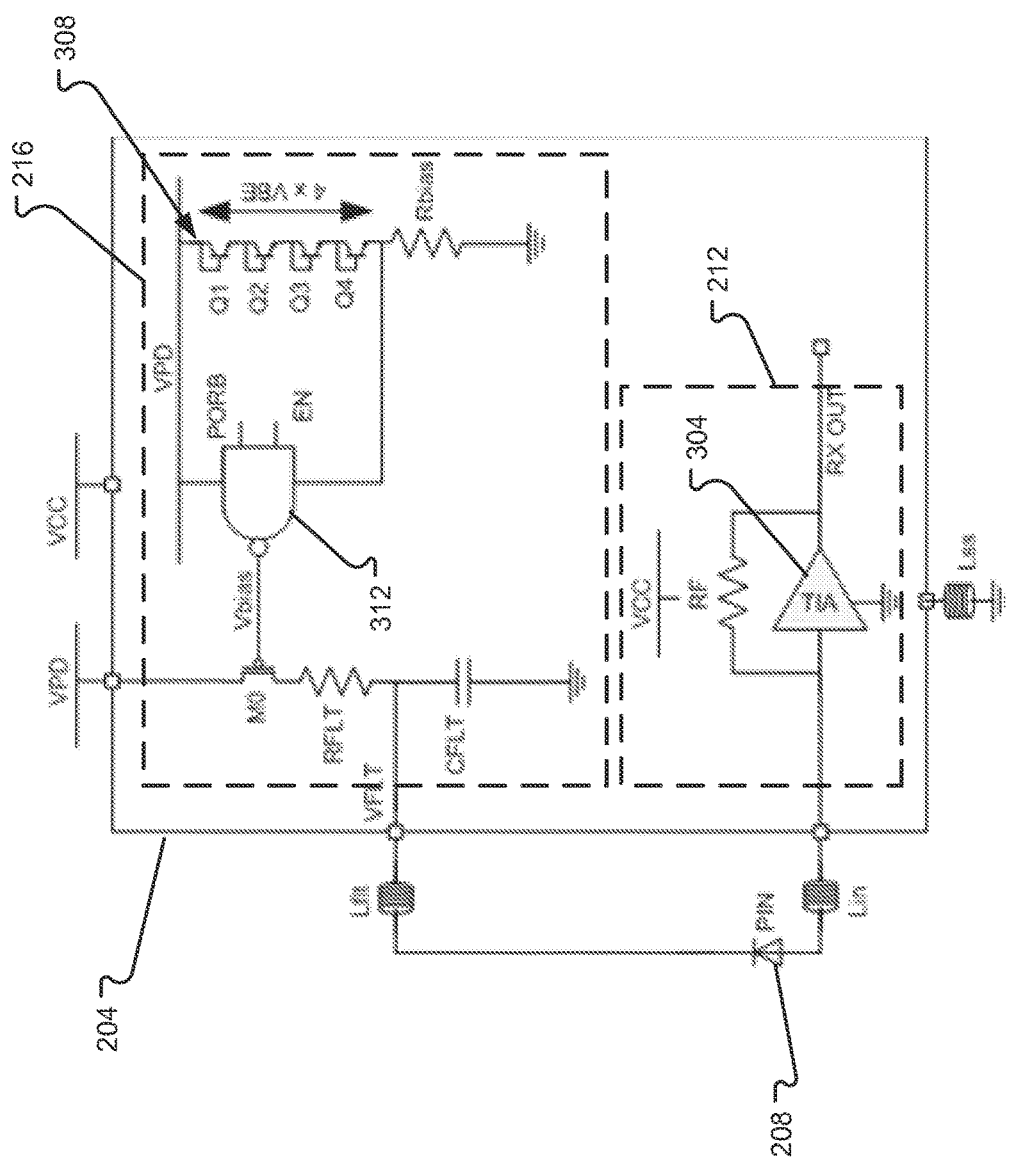
FIG. 3 is a circuit diagram depicting a photodiode biasing solution in accordance with at least some embodiments of the present disclosure.

With reference now to FIG. 3, additional details of one illustrative, but non-limiting, integrated photodiode biasing solution will be described in accordance with at least some embodiments of the present disclosure. The IC chip 204 is shown to include the control circuit 216 that is used to bias the optical component 208, which is depicted as a PIN diode. The IC chip 204 is also illustrated as comprising the amplifier 212, which receives the electrical output from the optical component 208 and provides an amplified output Rx out.

The amplifier 212 of FIG. 3 is specifically shown to include a TIA 304 having a feedback resistor Rf connected across it. The TIA 304 is connected to a common ground or reference voltage of the IC chip 204. The TIA 304 also operates with a supply voltage Vcc of the IC chip 204. In this embodiment, the optical component 208 is configured to operate using an external supply voltage Vpd that is a relatively high supply voltage. Furthermore, the external supply voltage Vpd is greater than the supply voltage Vcc of the TIA 304.

Because the external supply voltage Vpd is greater than the supply voltage Vcc of the TIA 304 (in the example of a high performance application), the control circuit 216 is provided to bias the optical component 208. The connection between the optical component 208 and the IC chip 204 creates an inherent inductance at both the input side Lin and the side connecting the biasing network to the optical component 208 Lflt. The control circuit 216 is also configured to operate as an on-chip filter (due to the filter capacitor Cflt) for the optical component 208. Because the control circuit 216 and its filter capacitor Cflt are provided on the IC chip 204, the control circuit 216 ensures a balanced high frequency ground path between the optical component 208 and the TIA 304.

The supply voltage for the control circuit 216 corresponds to the external supply voltage Vpd, which will effectively drive the optical component 208. However, the control circuit 216 is connected to the common ground on the IC chip 204, meaning that both the control circuit 216 and its components use the same ground or reference voltage as the amplifier(s) 212. This ensures no other artifacts are inserted into the output signal as a result of using different ground or reference voltages.

In some embodiments, the control circuit 216 comprises a biasing network configured to generate a modular logic level that scales with a bias voltage of the optical component 208. The depicted control circuit 216 also comprises a filter circuit connected between the biasing network and the optical component 208. In some embodiments, the filter circuit of the control circuit 216 comprises the filter capacitor Cflt and a filter resistor Rflt. A filter output voltage Vflt is provided to an output pad or lead of the IC chip 204, which is subsequently provided as an input to the optical component 208.

The biasing network of the control circuit 216 is shown to include a plurality of switching elements connected between a bias resistor Rbias and the supply voltage Vpd. The plurality of switching elements are also shown to be connected to filter transistor M0, which may correspond to a MetalOxideSemiconductor Field-Effect Transistor (MOSFET) or the like. As can be appreciated, the filter transistor M0 can be considered part of the filter circuit. In some embodiments, a logic element or logic gate connects the biasing network to the filter circuit. More specifically, the logic gate is shown to include a NAND gate, which outputs an output bias voltage to the filter transistor M0.

In some embodiments, the plurality of switching elements in the biasing network comprise a plurality of Bipolar Junction Transistors (BJTs) Q1, Q2, Q3, Q4 connected in series between the bias resistor and the photodiode biasing supply voltage. It should also be appreciated that N diodes or N diode connected CMOS transistors can be used in addition to or in lieu of the N diode-connected BJTs. Furthermore, the number N of diodes or diode-connected BJTs can be altered to accommodate different Vpd ranges and TIAs 304. Said another way, although four BJTs are depicted in FIG. 3, the number N of diodes or diode-connected BJTs can be any integer value greater than or equal to one. Because the biasing network is connected to the same supply voltage Vpd that is used to drive the optical component 208, the biasing network is able to generate a modular logic level that scales with the bias voltage of the optical component 208. Advantageously, the number N can be adjusted to ensure that the filtering transistor M0 is not overstressed or damaged due to the higher supply voltage Vpd used in high performance communication applications. Furthermore, the size of the TIA 304 does not have to be overly large so as to exactly match the supply voltage being used by the optical component 208 even though the external supply voltage Vpd is larger than the supply voltage Vcc driving the TIA 304.

The filtering transistor M0 receives the bias voltage Vbias and switches so as to provide the supply voltage Vpd into the rest of the filter circuit. As mentioned above, the output of the filter circuit Vflt is exposed via an output of the IC chip 204 and provided to the optical component 208.

As a non-limiting example, the supply voltage Vpd may range from 3.0V to 5.5V whereas the operational maximum voltage of the filter transistor M0 may be 3.3V. The biasing network enables the larger supply voltage Vpd to be used without overstressing the 3.3V filter transistor M0. In other words, the biasing network is configured to extend the voltage range (e.g., the usable value of the supply voltage Vpd) to match the requirements of the optical component 208 without exceeding the maximum breakdown voltage of the filter transistor M0.

If the filter circuit (e.g., filter capacitor Cflt and/or filter resistor Rflt) were provided external to the IC chip 204, a high frequency ground path may be created through the filter capacitor Cflt that is not the same to the TIAs 304 ground. This mismatch in ground paths ultimately degrades the high speed performance of the receiver 212 (e.g., by introducing noise, jitter, or other unwanted signal characteristics). In addition to using a common ground or reference voltage, the digital components of the filter circuit (e.g., the filter transistor M0) and the biasing network (e.g., the BJTs) may operate using a common clock signal of the IC chip 204.

Figure 4:
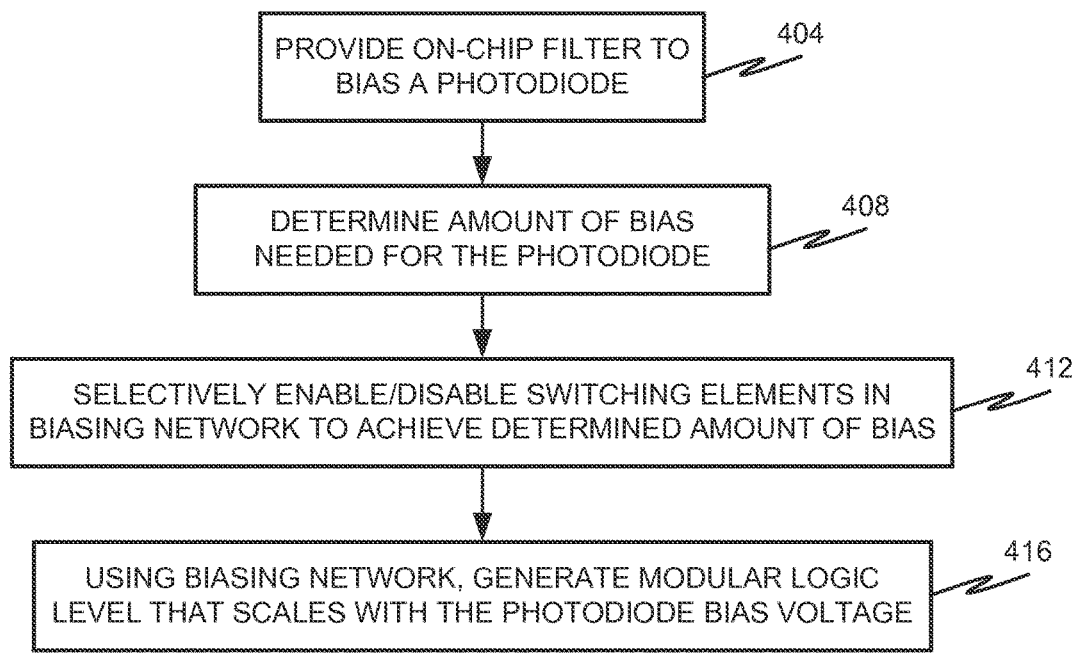
FIG. 4 is a flow diagram depicting a method of biasing a photodiode in accordance with at least some embodiments of the present disclosure.

With reference now to FIG. 4, a method of biasing a photodiode or similar type of optical component will be described in accordance with at least some embodiments of the present disclosure. The method begins by providing a control circuit 216 on an IC chip 204 that includes a filter circuit (step 404). Thus, an on-chip filter circuit is established in the IC chip 204 suitable for biasing a photodiode or the like.

The method continues by determining an amount of bias voltage needed for operating the photodiode (step 408). The bias of the PIN is regulated by N diode connected BJT, CMOS transistors or diodes in control circuit 216 to determine the amount of bias applied to the PIN diode. Based on the amount of bias voltage needed, one or more switching elements are selectively enables or disabled within a biasing network of the control circuit 216 to achieve the determined amount of bias (step 412). In other embodiments, a number N of diodes or diode-connected BJTs are selected based on the determined amount of bias and that number N of diodes or diode-connected BJTs are incorporated into the biasing network.

Once the biasing network is established on the IC chip 204, the method continues by using the biasing network to generate a modular logic level that scales with the bias voltage of the photodiode (step 416). This modular logic level may change as the operational behavior of the photodiode changes.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical communication system, comprising:
   a photodiode configured to receive light energy and convert the light energy into an electrical signal;

an amplifier configured to receive the electrical signal from the photodiode and output an amplified electrical signal, wherein the amplifier is driven by a supply voltage Vcc; and a control circuit comprising a biasing network having a plurality of switching elements connected in series between a photodiode biasing supply voltage Vpd and a bias resistor that is connected to a common reference voltage or ground, wherein the supply voltage Vcc is less than the photodiode biasing supply voltage Vpd, wherein the amplifier is also connected to the common reference voltage or ground, and wherein the biasing network provides a balanced high frequency ground path between the photodiode and the amplifier.

2. The optical communication system of claim 1, wherein the photodiode comprises a P-I-N diode.

3. The optical communication system of claim 1, wherein plurality of switching elements comprise at least four switching elements.

4. The optical communication system of claim 1, wherein the plurality of switching elements comprise a plurality of Bipolar Junction Transistors (BJTs) connected in series between the bias resistor and the photodiode biasing supply voltage Vpd.

5. The optical communication system of claim 4, wherein the plurality of BJTs are connected to a filter transistor that is part of a filter circuit for the amplifier.

6. The optical communication system of claim 5, wherein the filter transistor comprises a Metal-Oxide-Semiconductor Field-Effect Transistor (MOSFET) and wherein the plurality BJTs control a bias voltage provided to the MOSFET.

7. The optical communication system of claim 5, wherein the filter circuit further comprises a filter resistor and a filter capacitor that bias the photodiode to maintain the balanced high frequency ground path between the photodiode and the amplifier.

8. The optical communication system of claim 5, wherein the plurality of BJTs are connected to the filter transistor across a logic gate.

9. The optical communication system of claim 8, wherein the logic gate comprises a NAND gate.

10. The optical communication system of claim 5, wherein the filter circuit, the amplifier, and the control circuit are provided on a common Integrated Circuit (IC) chip.

11. A circuit, comprising:
a photodiode that receives optical signals and produces electrical signals in response thereto, wherein the photodiode is driven by an external supply voltage Vpd;
a trans-impedance amplifier that receives the electrical signals produced by the photodiode, wherein the trans-impedance amplifier is driven by a supply voltage Vcc that is less than the external supply voltage Vpd; and
a filter circuit that biases the photodiode to provide a balanced high frequency ground path between the photodiode and the trans-impedance amplifier, wherein the filter circuit receives a biasing voltage from a control circuit that shares a common reference or ground voltage with the trans-impedance amplifier, wherein the control circuit comprises a plurality of switching elements connected in series between the external supply voltage Vpd and a bias resistor, wherein the bias resistor is connected to the common reference or ground voltage, and wherein the control circuit is driven by the external supply voltage Vpd.

12. The circuit of claim 11, wherein the plurality of switching elements comprises at least four switching elements.

13. The circuit of claim 11, wherein the plurality of switching elements comprise a plurality of Bipolar Junction Transistors (BJTs) connected in series between the bias resistor and the external supply voltage Vpd.

14. The circuit of claim 13, wherein the plurality of BJTs are connected to a transistor that is part of the filter circuit for the amplifier.

15. The circuit of claim 14, wherein the plurality BJTs control the biasing voltage provided to the transistor.

16. The circuit of claim 15, wherein the plurality of BJTs are connected to the transistor across a logic gate.

17. The circuit of claim 11, wherein the filter circuit further comprises a filter resistor and a filter capacitor.

18. An Integrated Circuit (IC) chip, comprising:
a trans-impedance amplifier configured to receive an input electrical signal from a photodiode and provide an amplified version of the input electrical signal as an output, wherein the trans-impedance amplifier is driven by a supply voltage Vcc, wherein the photodiode is driven by an external supply voltage Vpd, and wherein the external supply voltage Vpd is greater than the supply voltage Vcc;
a control circuit that controls a bias voltage of the photodiode when the IC chip is connected to the photodiode, that is also driven by the external supply voltage Vpd, and that shares a common reference or ground voltage with the trans-impedance amplifier, wherein the control circuit comprises a plurality of switching elements connected in series between the external supply voltage Vpd and a bias resistor, and wherein the bias resistor is connected to the common reference or ground voltage; and
a filter circuit that biases the photodiode to ensure a balanced high frequency ground path between the photodiode and the trans-impedance amplifier.

19. The IC chip of claim 18, wherein the filter circuit receives a biasing voltage from the control circuit, wherein the plurality of switching elements comprise a plurality of Bipolar Junction Transistors (BJTs) connected in series between the bias resistor and the external supply voltage Vpd.

20. The IC chip of claim 19, wherein the plurality of BJTs are connected to a Metal-Oxide-Semiconductor Field-Effect Transistor (MOSFET) that is part of the filter circuit for the amplifier and wherein the plurality of BJTs are connected to the MOSFET via a logic gate that is responsive to an output of the plurality of switching elements.

* * * * *